(12) United States Patent
Morii

(10) Patent No.: US 7,056,180 B2
(45) Date of Patent: Jun. 6, 2006

(54) MANUFACTURING METHOD OF ORGANIC ELECTROLUMINESCENT DEVICE, ORGANIC ELECTROLUMINESCENT DEVICE, AND ELECTRONIC APPARATUS

(75) Inventor: Katsuyuki Morii, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 304 days.

(21) Appl. No.: 10/745,583

(22) Filed: Dec. 29, 2003

(65) Prior Publication Data

US 2004/0157167 A1    Aug. 12, 2004

(30) Foreign Application Priority Data

Dec. 26, 2002  (JP) .............................. 2002-377291

(51) Int. Cl.
*H01J 9/02*    (2006.01)
(52) U.S. Cl. ........................ 445/35; 445/29; 445/46
(58) Field of Classification Search ........ 313/504–505, 313/506; 445/24, 35, 29, 46; 428/690, 697
See application file for complete search history.

(56) References Cited

U.S. PATENT DOCUMENTS

| | | | |
|---|---|---|---|
| 6,091,196 A * | 7/2000 | Codama ................ | 445/24 |
| 2001/0033944 A1 * | 10/2001 | Onikubo et al. ........... | 313/504 |
| 2001/0050532 A1 * | 12/2001 | Eida et al. ................ | 445/24 |
| 2002/0060518 A1 * | 5/2002 | Duineveld et al. .......... | 313/506 |
| 2002/0079832 A1 * | 6/2002 | Van Tongeren et al. .... | 313/504 |
| 2005/0032454 A1 * | 2/2005 | Yamanaka ................ | 445/24 |
| 2005/0073249 A1 * | 4/2005 | Morii et al. .............. | 313/504 |
| 2005/0118457 A1 * | 6/2005 | Morii .................... | 313/504 |

FOREIGN PATENT DOCUMENTS

| | | |
|---|---|---|
| JP | 4-363896 | 12/1992 |
| JP | 5-251186 | 9/1993 |
| JP | 8-273832 | 10/1996 |
| JP | 9-330791 | 12/1997 |
| JP | 11-8075 | 1/1999 |
| JP | 2000-268980 | 9/2000 |
| JP | 2001-126876 | 5/2001 |
| JP | 2001-284061 | 10/2001 |

OTHER PUBLICATIONS

Stobel, M. et al. "Electron Injection and transport in 8-hydroxyquinoline aluminum" *Synthetic Metals* 111-112 (2000).
Kasim, Ramesh K. et al. "A Simple Method for Fabricating Polymeric Light-Emitting Diodes" *Chem. Mater* 1998, 235-37.
Sakuratani, Yuhki et al. "All-wet fabrication of an organic electroluminescent device" *Thin Solid Films* 256-259 (2000).

* cited by examiner

*Primary Examiner*—Joseph Williams
*Assistant Examiner*—Peter Macchiarolo
(74) *Attorney, Agent, or Firm*—Oliff & Berridge, PLC

(57) ABSTRACT

A method manufactures an organic EL device by forming cathodes by a liquid phase process depositing a dispersion liquid containing ultra-fine ytterbium (Yb) particles using an inkjet method, followed by drying.

5 Claims, 8 Drawing Sheets

MANUFACTURING METHOD OF ORGANIC ELECTROLUMINESCENT DEVICE, ORGANIC ELECTROLUMINESCENT DEVICE, AND ELECTRONIC APPARATUS

BACKGROUND OF THE INVENTION

1. Field of Invention

The present invention relates to methods to manufacture an organic electroluminescent (hereinafter referred to as "organic EL") device, organic EL devices manufactured by the above-mentioned methods, and electronic apparatuses using the above-mentioned organic EL devices.

2. Description of Related Art

Due to high brightness, self-luminescence, quick response, luminescence by a solid organic film, and being able to be driven by a DC low voltage, an organic EL display device including a plurality of organic EL elements (elements each having the structure composed of an organic light emitting layer placed between an anode and a cathode) provided correspond to respective pixels, can exhibit superior display performance and can achieve a thin and light-weight structure, and low power consumption. Therefore, organic EL display devices have been expected to replace liquid crystal display devices in future.

As a material for light emitting layers of an organic EL element, for example, a low molecular weight organic material, such as an aluminum-quinolinol complex (Alq3), and a high molecular weight organic material (hereinafter referred to as a "polymer material"), such as polyparaphenylenevinylene (PPV), may be mentioned. When a polymer material is used, a solution thereof may be applied to form a light emitting layer.

In particular, in an organic EL display device in which a great number of pixels must be formed, when light emitting layers can be formed by applying a solution containing a polymer material using an inkjet method, significant advantages from a production point of view can be obtained. That is, when an inkjet method is used, coating and patterning can be simultaneously performed, and hence patterning can be precisely performed within a short period of time.

Furthermore, since the amount of a material which is used by an ink-jet method can be minimized, the material can be efficiently used, and as a result, the manufacturing cost can be advantageously decreased.

In FIG. 12, a related art example of an organic EL display device is shown in which light emitting layers (and hole injection layer/transport layers) are formed by an inkjet method. Since this organic EL display device is an active matrix organic EL display device, a drive thin film transistor 913 is provided in each pixel.

In this organic EL display device, after an ITO thin film is formed by deposition and then patterned corresponding to the pixels to form pixel electrodes (anodes) 911 over a substrate 802 on which the thin film transistors 913 have been provided, partitions (banks) 912 are formed using an insulating layer, and a hole injection/transport layer 910a and a light emitting layer 910b are formed by an inkjet method in each of areas surrounded by the partitions. Subsequently, over the entire upper surfaces of the partitions (banks) 912 and the light emitting layers 910b, a cathode 812 is formed by a deposition method.

According to the related art example of the organic EL display device described above, the light emitting layers and the hole injection/transport layers are formed by an inkjet method which is a liquid phase process, but the formation of thin films forming the pixel electrodes (anodes) and the cathode is carried out by a deposition method. Since a deposition method is performed in a vacuum atmosphere, which is a gas phase process, the manufacturing cost thereof is high. Hence, investigation has been conducted in order to perform a liquid phase process for forming the pixel electrodes (anodes) and the cathode instead of using a deposition method.

As a liquid phase process for forming the pixel electrodes (anodes), a related art example has been known in which an ITO film is obtained by applying a solution followed by drying. In addition, as a liquid phase process for forming the cathode, a method has been reported in which a cathode is formed by an electroless plating method using silver (Ag). See for example, Y. Sakuratani et al.; Thin Solid Film 388, 256 (2001) and R. K. Kasim et al.; Chem. mater. 10, 235 (1998)

In addition, an example in which ytterbium (Yb) is used for a cathode of an organic EL element has been known. See for example, M. Stoβel et al.; Synthetic. Metals. 111–112, (2000) 19–24.

However, since silver (Ag) has a large work function, the properties (luminescent efficiency, luminance, threshold voltage, and the like) of an organic EL element using silver for a cathode have not reached the level of practical use. In addition, although an electroless plating method is a liquid phase process, compared to an inkjet method, advantages in view of production are not significant, and the properties (such as luminescent efficiency) of the organic EL element mentioned above may be degraded in some cases.

SUMMARY OF THE INVENTION

The present invention was made in order to address the problems of the related art techniques described above. The present invention provides a method to manufacture an organic EL device, in which a cathode is formed by a liquid phase process, the method being capable of obtaining properties of an organic EL element at the level of practical use and having an effect of significantly decreasing the manufacturing cost.

To this end, in accordance with one aspect of the present invention, there is provided a method to manufacture an organic electroluminescent device, which includes a step of forming first cathodes constituting organic EL elements using a liquid material which contains a rare earth element or the alloy thereof.

The liquid material may be a liquid containing particles of a rare earth element or the alloy thereof.

In an exemplary embodiment of the manufacturing method according to an aspect of the present invention, for example, the particles have a particle diameter of 1 to 100 nm, and droplets composed of the liquid material are placed on a substrate and then a dispersion medium is evaporated from the droplets to have the first cathodes, made of a rare earth element or the alloy thereof, formed on the substrate.

The rare earth element is a generic name for scandium (Sc), Yttrium (Y) and lanthanoid elements and actinoid elements as described below. The actinoid element is also referred to as a "second rare earth element" in some cases. The lanthanoid elements are lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). The actinoid elements are actinium (Ac), thorium (Th), protactinium (Pa), uranium (U), neptunium (Np), plutonium (Pu), americium (Am), curium (Cm), berkelium (Bk), californium (Cf), einsteinium (Es), fermium (Fm), mendelevium (Md), nobelium (No), and lawrencium (Lr).

As the rare earth element used in the method of an aspect of the present invention, the lanthanoid elements mentioned above are preferably used, an element having a larger atomic number among the lanthanoid elements is more preferable, and ytterbium (Yb) is particularly preferable. This is because ytterbium has a work function smaller than that of calcium which has been used for a cathode of an organic EL element, and still more, is highly stable. Hence, by using ytterbium as the cathodes, an organic El element having properties at the level of practical use can be obtained.

Particles (hereinafter referred to as "ultra-fine particles") composed of a rare earth element having a particle diameter of 1 to 100 nm and ultra-fine particles composed of an alloy of a rare earth element can be obtained, for example, by a gas phase deposition method. The gas phase deposition method is a method to form ultra-fine particles by the steps of evaporating a metal in an inert gas atmosphere, followed by condensation thereof. Because of different condensation steps of an evaporated gas, the gas phase deposition method is categorized into a solvent trap process and a cold trap process.

As the liquid media used for the liquid material described above, which is a solution or a dispersion liquid containing the particles described above, linear hydrocarbons in the liquid form at room temperature or a mixture thereof may be used. For example, there may be mentioned mineral spirit, tridecane, and dodecylbenzene.

The method of an aspect of the present invention described above may further include a step of forming a second cathode on the first cathodes which are formed of the liquid material including a rare earth element or the alloy thereof, the second cathode being formed of a material different from that for the first cathodes.

Particular examples of the method described above include: a method (1) in which the first cathodes are formed in pixel regions of the organic electroluminescent elements on a substrate, followed by the formation of the second cathode over the entire surface of the substrate; a method (2) in which the pixel composed of the organic electroluminescent elements are formed in a matrix (along rows and columns) (for example, pixels being provided at opening portions of a grating pattern) on a surface of the substrate, the first cathodes are formed in pixel regions of the organic electroluminescent elements, and the second cathode is formed so as to have a grating pattern composed of frames connecting the pixel regions to each other along rows and columns of the matrix, the frames each having a width covering the entirety of each of the pixel regions of the organic electroluminescent elements; and a method (3) in which the second cathode is formed using a liquid material.

According to the method (2) described above, compared to the case of the method (1), since the reflection of light emitted from the light emitting layer can be reduced, the contrast between organic EL elements can be advantageously enhanced.

In addition, an aspect of the present invention provides an organic electroluminescent device manufactured by a method of an aspect of the present invention.

Furthermore, as aspect of the present invention provides an electronic apparatus using the organic electroluminescent device manufactured by a method of an aspect of the present invention.

DETAILED DESCRIPTION OF PREFERRED EMBODIMENTS

Hereinafter, exemplary embodiments of the present invention will be described.

With reference to FIGS. 1 to 10, a method to manufacture an organic EL device according to an exemplary embodiment of the present invention will be described.

Figure 1:
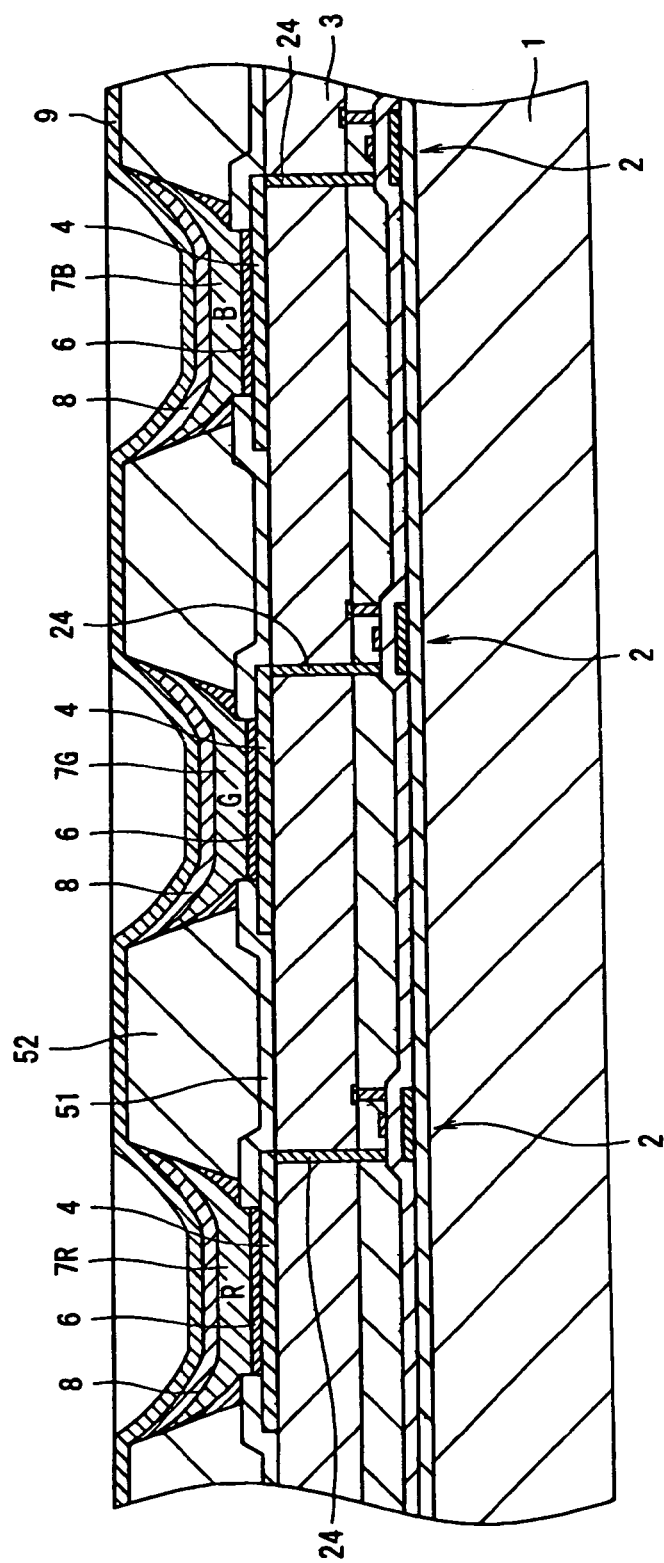
FIG. 1 is a cross-sectional view showing an organic EL display device manufactured by a method according to an exemplary embodiment of the present invention.

The organic EL device formed in this exemplary embodiment is a color organic EL display device. As shown in FIG. 1, many organic EL elements each having a red light emitting layer 7R, many organic EL elements each having a green light emitting layer 7G, and many organic EL elements each having a blue light emitting layer 7B are provided as pixels at predetermined positions on a surface of a substrate.

Figure 2:
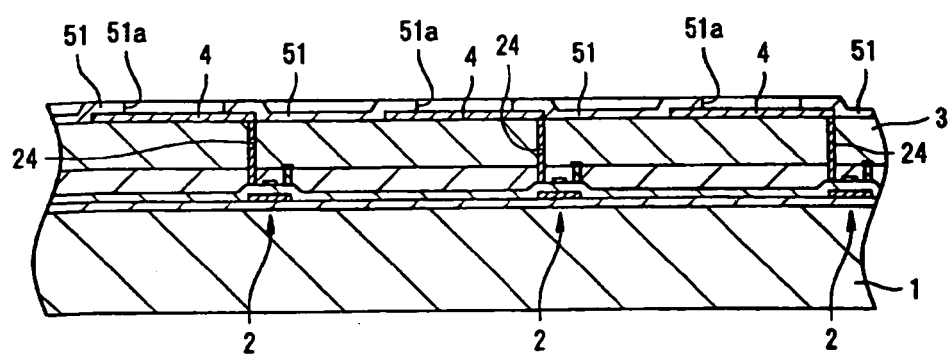
FIG. 2 is a cross-sectional view for illustrating a manufacturing step of the organic EL display device shown in FIG. 1.

First, as shown in FIG. 2, after thin film transistors 2 are formed on a glass substrate 1 for respective pixels, an insulating layer 3 is formed. Next, wires 24 are formed in this insulating layer 3 for connecting the thin film transistors 2 for the respective pixels to anodes (pixel electrodes) 4.

Subsequently, the anodes 4 composed of ITO ($In_2O_3$—$SnO_2$) are formed at pixel positions by common steps, that is, an ITO thin film forming step, a photolithographic step, and an etching step. Accordingly, after the wires 24 described above are formed, the anodes 4 made of ITO are formed at the respective pixel positions on the glass substrate 1.

Next, over this glass substrate 1, first partitions 51 made of silicon dioxide, each having an opening portion 51a corresponding to each light emitting region, are formed by common steps, that is, a silicon oxide thin film forming step, a photolithographic step, and an etching step. FIG. 2 shows the state described above. The first partitions 51 are each formed such that the peripheral edge portion of the opening portion 51a overla☐Ps the outer edge portion of the anode 4.

Figure 3:
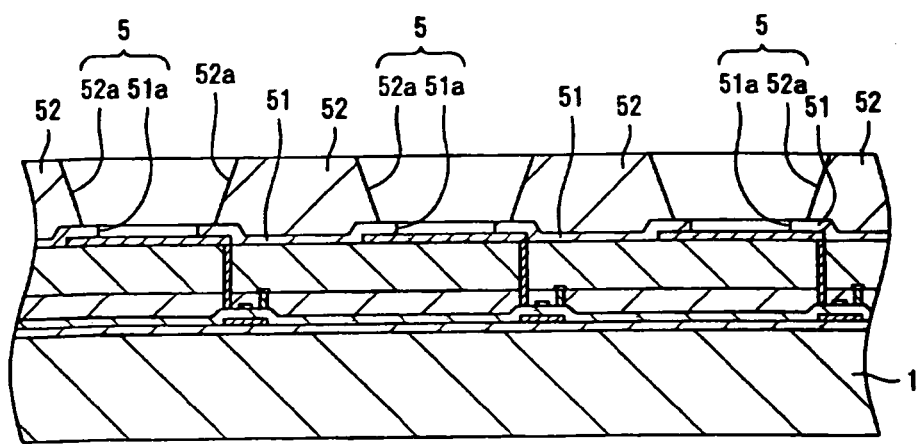
FIG. 3 is a cross-sectional view for illustrating a manufacturing step of the organic EL display device shown in FIG. 1.

Next, as shown in FIG. 3, on the first partitions 51, second partitions 52, each having an opening portion 52a corresponding to each light emitting region, are formed. This second partitions 52 are made of a polyamide resin and are formed by a step of applying a solution containing a polyamide resin, a step of drying the applied solution to form a film, a photolithographic step, and an etching step.

The opening portion 52a of the second partition 52 is formed such that its cross section perpendicular to the surface of the substrate has a tapered shape with the size increasing as the distance from the glass substrate 1 increases. In addition, even at a position closest to the glass substrate 1, the opening area of the opening portion 52a of the second partition 52 is larger than that of the opening portion 51a of the first partition 51. Accordingly, partitions, each having a two-step opening portion 5, are formed. In this exemplary embodiment, by the opening portion 51a of the first partition 51, the light emitting region of each pixel is precisely controlled. In addition, the second partition 52 is formed to have a predetermined thickness in order to ensure the depth of the opening portion 5 and is formed to have a tapered shape so that a solution is easily introduced into the opening portion 5 even when being deposited onto the upper surface of the second partition 52.

Figure 4:
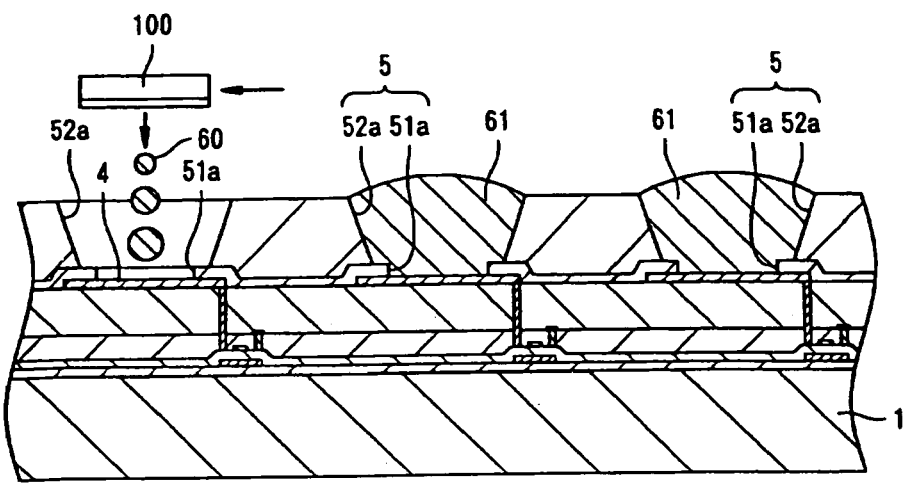
FIG. 4 is a cross-sectional view for illustrating a manufacturing step of the organic EL display device shown in FIG. 1.

Next, as shown in FIG. 4, a solution 60 containing a material to form a hole injection/transport layer is deposited to each anode 4 from right above the each opening portion 5 by an inkjet method. Reference numeral 100 in FIG. 4 indicates an inkjet head. By the step described above, a droplet 61 composed of the solution mentioned above is provided on each pixel electrode 4.

As the material to form a hole injection/transport layer, for example, a mixture of a polythiophene derivative, such as polyethylene dioxythiophene (PEDOT) and polystyrenesulfonic acid (CPSS) or the like may be used. A solution containing these materials dissolved in a polar solvent may be used as the solution 60. As polar solvents, for example, there may be mentioned isopropyl alcohol (IPA), normal butanol, γ-butyrolactone, N-methyl pyrrolidone (NMP), 1,3-dimethyl-2-imidazolidinone (DMI) and derivatives thereof, and glycol ethers, such as carbitol acetate and butylcarbitol acetate.

As a particular composition of the solution 60, for example, a solution may be mentioned containing 12.52 percent by weight of PEDOT/CPSS mixture (PEDOT/CPSS=1/20), 10 percent by weight of IPA, 27.48 percent by weight of NMP, 50 percent by weight of DMI. In addition, the viscosity of this solution is preferably in the range of approximately 2 to 20 CPs, and more preferably in the range of approximately 4 to 15 CPs. When a solvent as described above is used, an ejection nozzle of the inkjet head 100 may not be clogged, and hence stable ejection can be performed.

In this exemplary embodiment, as a material to form the hole injection/transport layer, the same material may be used for the light emitting layers 7R, 7G, and 7B having red (R), green (G), and blue (B) colors, respectively, or different materials may be used for the individual colors.

Figure 5:
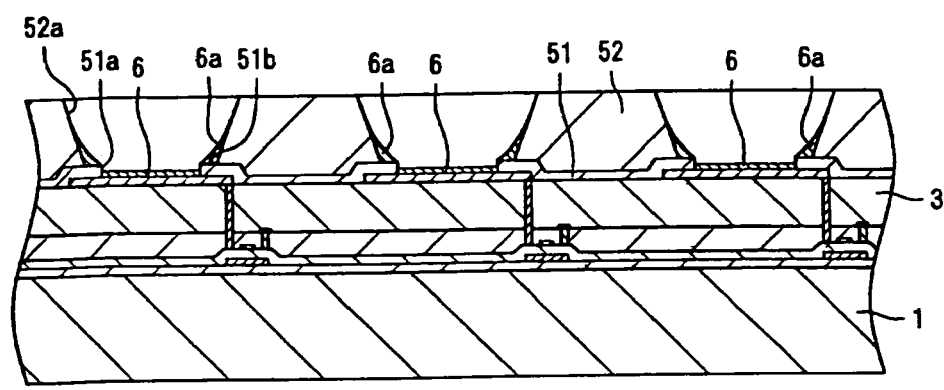
FIG. 5 is a cross-sectional view for illustrating a manufacturing step of the organic EL display device shown in FIG. 1.

Next, by performing a drying step, the solvent is removed from the droplets 61 by evaporation. Accordingly, as shown in FIG. 5, the hole injection/transport layer 6 is formed on each pixel electrode 4. In this step, the hole injection/transport layer 6 is formed not only in the first opening portions 51a but also in a corner portion between an upper surface 51b of the periphery of the opening portion 51a of the first partition 51 and the wall surface of the opening portion 52a of the second partition 52. Reference numeral 6a in FIG. 5 indicates a hole injection/transport layer formed along this corner portion.

Figure 6:
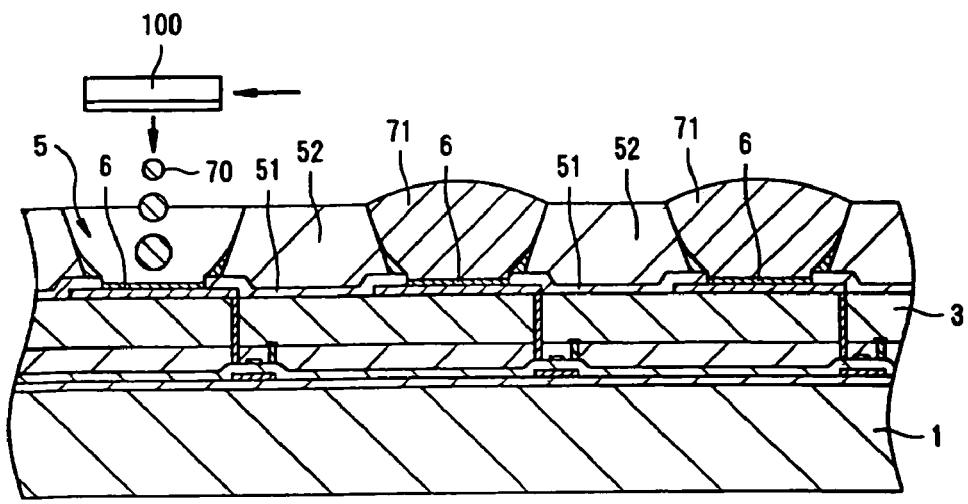
FIG. 6 is a cross-sectional view for illustrating a manufacturing step of the organic EL display device shown in FIG. 1.

Next, as shown in FIG. 6, solutions 70 containing light emitting materials of different colors, which correspond to the individual hole injection/transport layers 6, are deposited thereto from right above the respective opening portions 5 by an inkjet method. Reference numeral 100 in FIG. 6 indicates an inkjet head. By the step described above, droplets 71 composed of the solutions described above are provided on the respective hole injection/transport layers 6.

As the light emitting materials of the organic EL elements, for example, there may be mentioned polyfluorene-based polymer derivatives represented by the following compounds 1 to 5, polyparaphenylenevinylene derivatives, polyphenylene derivatives, polyvinyl carbazole, polythiophene derivatives, perylene-based dyes, coumarin-based dyes, rhodamine-based dyes, and the above-mentioned polymers doped with an organic EL material. As a doping material, for example, rubrene, perylene, 9,10-diphenyl anthracene, tetraphenyl butadiene, Nile Red, coumarin 6, and quinacuridone may be mentioned.

Compound 1

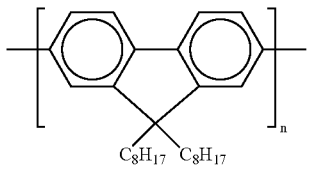

Chemical 1

Compound 2

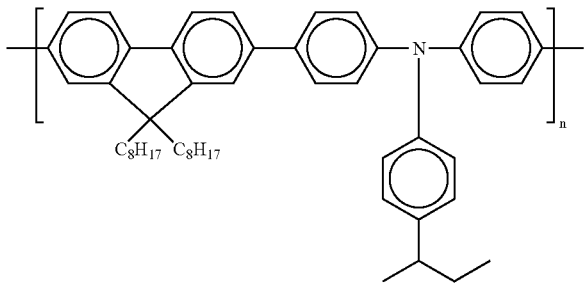

Chemical 2

Compound 3

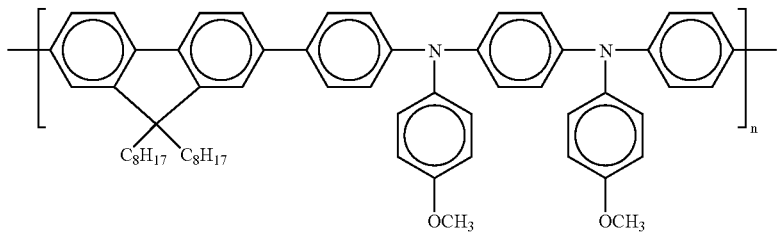

Chemical 3

Compound 4

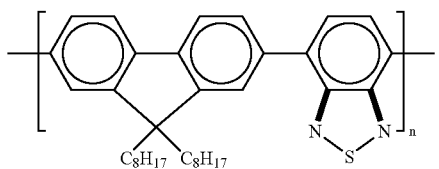

Compound 5

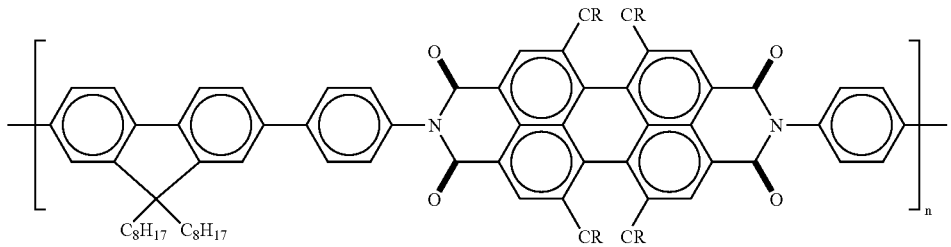

Chemical 5

In addition, as a red light emitting material, for example, MEH-PPV (poly(methoxy-(2-ethyl(hexyloxy-paraphenylenevinylene) may be used; as a blue light emitting material, for example, polydioctylfluorene may be used; and as a green light emitting material, for example, PPV (polyparaphenylenevinylene) may be used;

Solutions containing the above light emitting materials dissolved in a nonpolar solvent are used as the solutions 70. As the nonpolar solvent used in this exemplary embodiment, a solvent which will not dissolve the hole injection/transport layer 6 is preferably used, and for example, cyclohexylbenzene, dihydrobenzofurane, trimethylbenzene, and tetramethylbenzene may be used.

Figure 7:
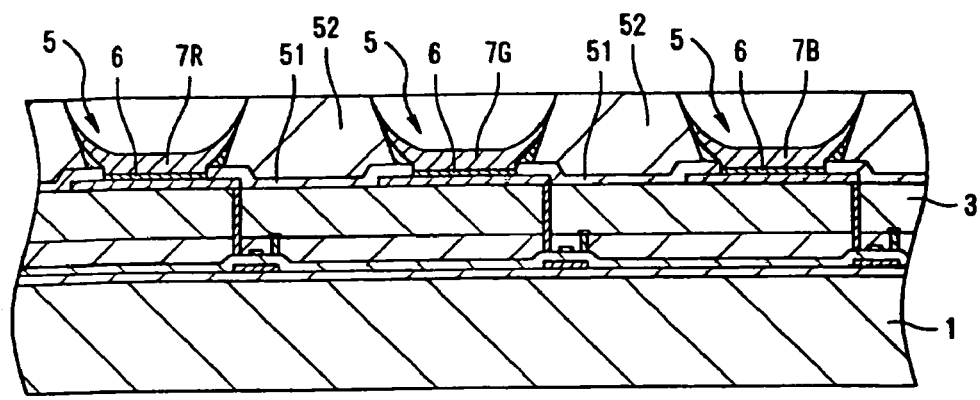
FIG. 7 is a cross-sectional view for illustrating a manufacturing step of the organic EL display device shown in FIG. 1.

Next, by performing a drying step, the solvent is removed from the droplets 71 by evaporation. Accordingly, as shown in FIG. 7, the light emitting layers 7R, 7G, and 7B having different colors are formed on the respective hole injection/transport layers 6.

Figure 8:
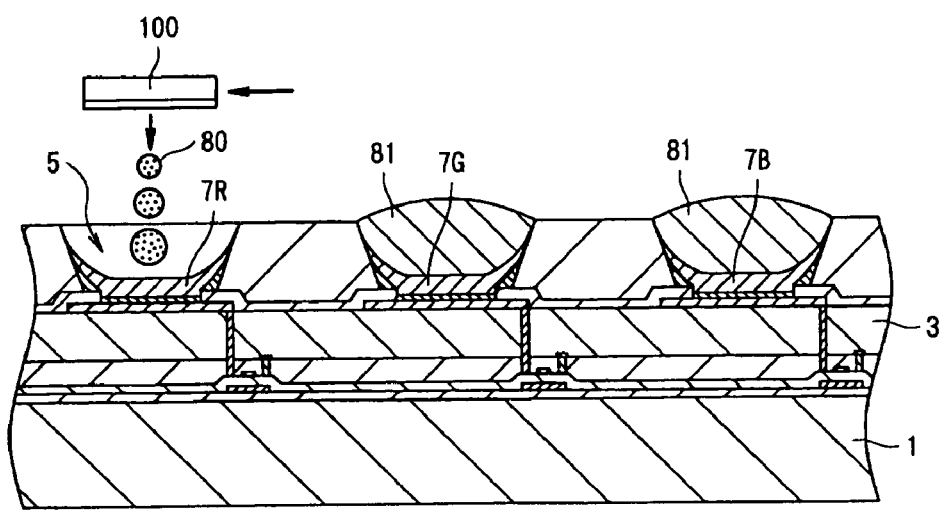
FIG. 8 is a cross-sectional view for illustrating a manufacturing step of the organic EL display device shown in FIG. 1.

Subsequently, as shown in FIG. 8, a dispersion liquid 80 containing ultra-fine particles (an average particle diameter of 1 to 100 nm) of ytterbium (Yb) is deposited to the individual light emitting layers 7R, 7G, and 7B from right above the respective opening portions 5 by an inkjet method. Reference numeral 100 in FIG. 8 indicates an inkjet head. Accordingly, droplets 81 composed of the dispersion liquid are provided on the light emitting layers 7R, 7G, and 7B.

The ultra-fine particles of ytterbium (Yb) can be obtained by the following process (solvent trap process) of a gas phase deposition method. Ytterbium (Yb) is evaporated at a He pressure of 0.5 Torr, and ultra-fine ytterbium particles in a growth process are brought into contact with tridecane vapor for cooling. As a result, a dispersion liquid containing ultra-fine ytterbium particles dispersed in tridecane can be obtained. This dispersion liquid may be used as the dispersion liquid 80.

Figure 9:
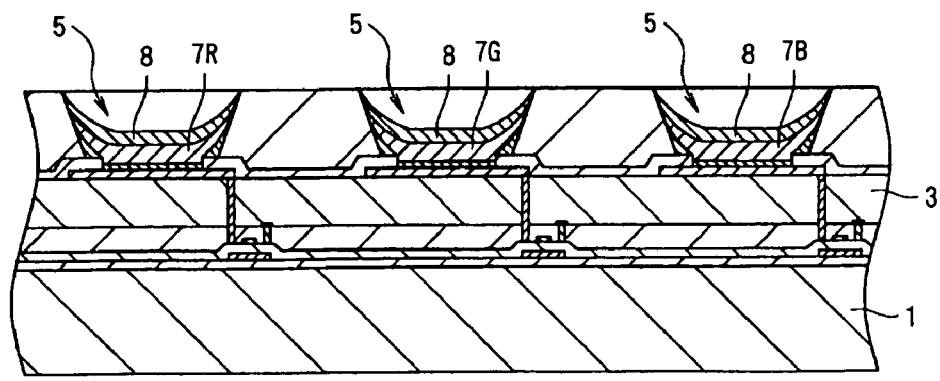
FIG. 9 is a cross-sectional view for illustrating a manufacturing step of the organic EL display device shown in FIG. 1.

Next, by performing a drying step, the dispersion medium is removed from the droplets 81 by evaporation. This drying step may be performed by maintaining an inert gas atmosphere at a temperature of 150° C. Accordingly, as shown in FIG. 9, cathode layers (first cathodes) 8 made of ytterbium are formed on the individual light emitting layers 7R, 7G, and 7B.

Figure 10:
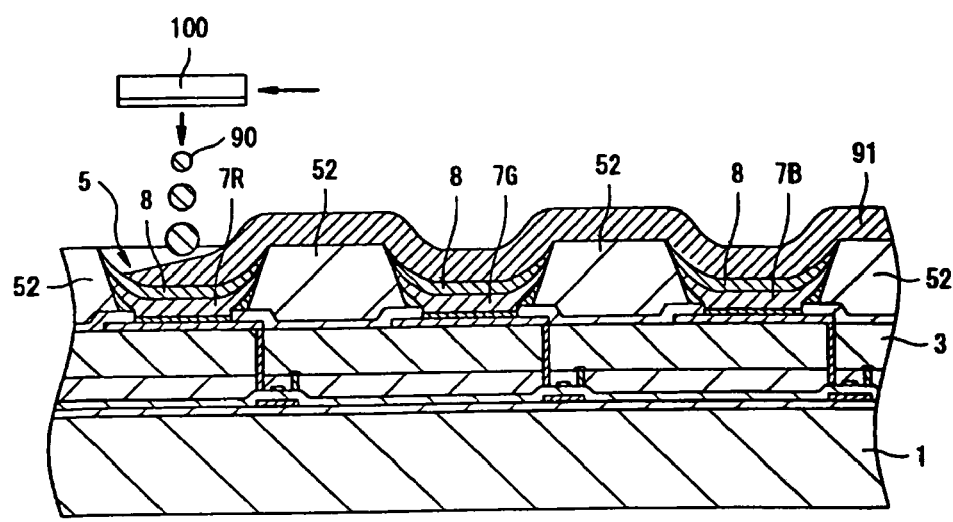
FIG. 10 is a cross-sectional view for illustrating a manufacturing step of the organic EL display device shown in FIG. 1.

Subsequently, as shown in FIG. 10, a dispersion liquid 90 containing conductive fine particles is deposited on the entire surface of the substrate 1 in the state shown in FIG. 9. As this dispersion liquid 90, a dispersion liquid containing fine particles made of gold or silver may be used. The dispersion liquid is "PERFECT GOLD" manufactured by Vacuum Metallurgical Co., Ltd. In particular, a dispersion liquid containing ultra-fine silver particles may be mentioned which is formed by adding an aqueous sodium citrate solution. Reference numeral 100 in FIG. 10 indicates an inkjet head. As a result, a liquid layer 91 composed of the dispersion liquid described above is provided on the first cathode layers 8 in the opening portions 5 and on the second partitions 52.

Next, by performing a drying step, the dispersion medium is removed from the liquid layer 91 by evaporation. Accordingly, as shown in FIG. 1, a second cathode 9 is formed on the entire surface of the substrate 1 (that is, on the first cathodes 8 in the opening portions 5 of the pixel region and on the second partitions 52).

Subsequently, after an epoxy resin adhesive is applied onto the entire upper surface of the substrate 1 and exterior side surfaces of the second partitions 52 located at the peripheral position of the substrate so as to have a predetermined thickness, a glass plate is placed on the epoxy resin adhesive, and the adhesive is then cured. That is, the entire upper surface of the second cathode 9 is covered with the epoxy resin adhesive. As described above, sealing is performed using the sealing material and the glass plate, and hence an organic EL display panel constituting an organic EL display device is completed.

In addition, when this panel is fitted to a main body having a drive circuit and the like, an organic EL display device can be obtained.

According to the method of this exemplary embodiment, as the cathode of the organic EL display device, a layer made of ytterbium having a work function smaller than that of calcium and high stability is used, and hence the properties of the organic EL element forming the pixel can reach the level of practical use. In addition, since the cathode layer made of ytterbium is formed by depositing the dispersion liquid containing ultra-fine ytterbium particles using an inkjet method, followed by drying, the manufacturing cost can be decreased as compared to that in the case of a deposition method.

Furthermore, because of the structure that the first cathodes made of active ytterbium are only formed inside the pixels and are covered with the second cathode, more stable properties can be obtained.

In addition, since the step of forming the pixel electrodes and subsequent steps therefrom are all performed by a liquid phase process, all layers forming the organic EL element are formed by a liquid phase process. In this case, when a substrate is prepared on which thin film transistors and wires from the thin film transistors to the respective pixel electrodes have been formed beforehand, the organic EL element can be formed without performing any step in a vacuum atmosphere.

Figure 11A:
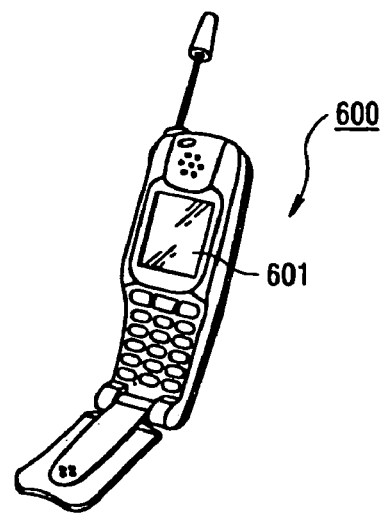
FIGS. 11(A)–11(C) include perspective views showing examples of electronic apparatuses to which an organic EL device of an aspect of the present invention is applied.
Figure 11B:
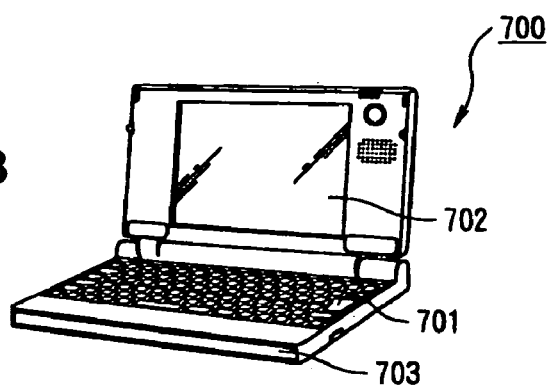
Figure 11C:
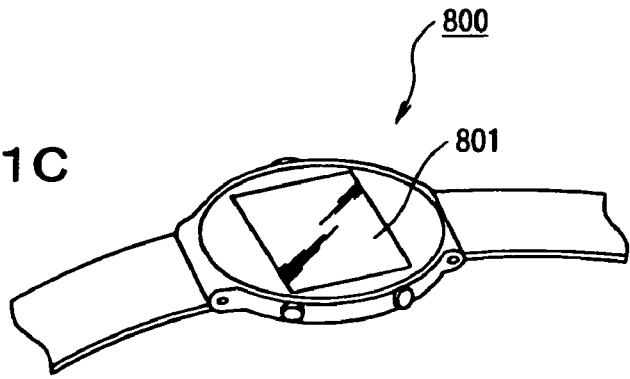
Figure 12:
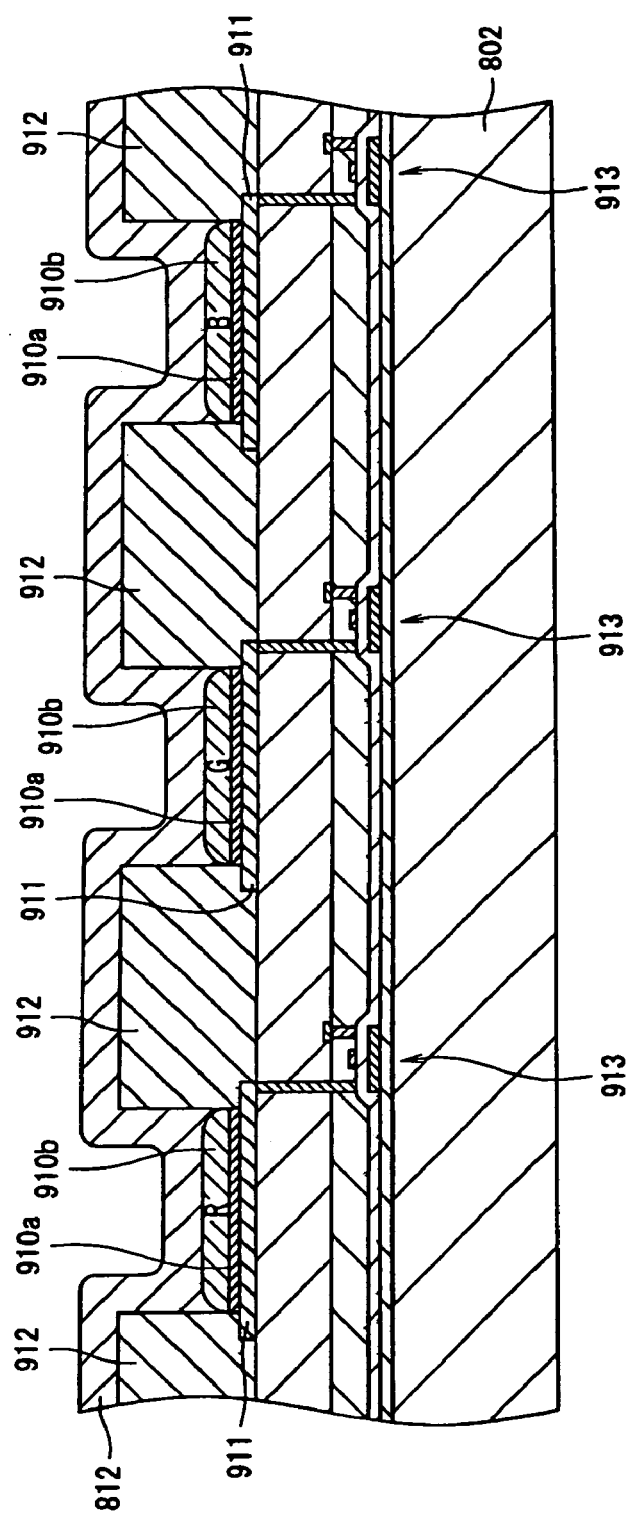
FIG. 12 is a cross-sectional view showing a related art example of an organic EL display device in which light emitting layers and hole injection/transport layers are formed by an inkjet method.

The organic EL device of an aspect of the present invention may be applied to various electronic apparatuses, for example, as shown in FIGS. 11(A)–11(C).

FIG. 11(A) is a perspective view showing one example of a mobile phone. In FIG. 11(A), reference numeral 600 indicates a mobile phone body, and reference numeral 601 indicates a display portion using the organic EL display device described above.

FIG. 11(B) is a perspective view showing one example of a portable information processing device, such as a word processor or a personal computer. In FIG. 11(B), reference numeral 700 indicates an information processing device, reference numeral 701 indicates an input portion, such as a keyboard, reference numeral 703 indicates an information processing device body, and reference numeral 702 indicates a display portion using the organic EL display device described above.

FIG. 11(C) is a perspective view showing one example of a wristwatch type electronic apparatus. In FIG. 11(C), reference numeral 800 indicates a watch body, and reference numeral 801 indicates a display portion using the organic EL display device described above.

The electronic apparatuses shown in FIGS. 11(A) to 11(C) are each provided with the organic El display device as a display portion, which is manufactured by the method described in the exemplary embodiment, and have the advantages of the above-described manufacturing method of the organic EL display device. Hence, a method to manufacture the electronic apparatuses described above can be easily performed.

In addition, in the exemplary embodiment described above, by using the dispersion liquid containing ultra-fine ytterbium particles, the cathode layer made of ytterbium is formed by a liquid phase process. However, the method of an aspect of the present invention is not limited to a method using a dispersion liquid containing ultra-fine particles made of a rare earth element, and for example, the present invention may include a method including the steps of depositing a liquid containing a complex of a rare earth element by an inkjet method, and then removing a liquid from the complex.

In addition, in the exemplary embodiment described above, the organic EL display device is described; however, in addition to the display device, the present invention may be applied to other organic EL devices, such as a light source. Furthermore, as materials to form the constituent elements of the organic EL device other than those for the cathode, materials which have been known may be used.

Advantages

As described above, according to an aspect of the present invention, a method to manufacture an organic EL device is provided in which cathodes are formed by a liquid phase process, the properties of the organic EL element are enhanced to the level of practical use and a superior effect of significantly decreasing the manufacturing cost can be realized.

What is claimed is:

1. A method of manufacturing an organic electroluminescent device, comprising:
   forming a plurality of anodes over a substrate;
   forming a plurality of organic electroluminescent films over the plurality of anodes; and
   forming a plurality of first cathodes over the plurality of organic electroluminescent films by applying a plurality of droplets of dispersion, each of the droplets including a plurality of dispersed particles, each of the plurality of dispersed particles having a particle diameter of 1 to 100 nm, the dispersed particles including ytterbium (Yb).

2. The method of manufacturing an organic electroluminescent device according to claim 1, further comprising:
   forming a second cathode on the plurality of first cathodes, the second cathode including a material that is not included in the plurality of first cathodes.

3. The method of manufacturing an organic electroluminescent device according to claim 2, further comprising:
   forming a bank over the substrate before the forming of the plurality of organic semiconductor layers, the bank separating the plurality of the anodes from each other, the plurality of organic semiconductor layers not overlapping a top of the bank, the plurality of first cathodes not overlapping the top of the bank, the second cathode overlapping at least a part of the top of the bank.

4. The method of manufacturing an organic electroluminescent device according to claim 2, the second cathode being formed by applying a liquid material.

5. A method of manufacturing an electro apparatus including the method of manufacturing an organic electroluminescent device according to claim 1.

\* \* \* \* \*